United States Patent
Fish et al.

(10) Patent No.: US 7,291,968 B2
(45) Date of Patent: Nov. 6, 2007

(54) ACTIVE MATRIX ELECTROLUMINESCENT DISPLAY DEVICES, AND THEIR MANUFACTURE

(75) Inventors: David Andrew Fish, Haywards Heath (GB); Mark Jonathan Childs, Sutton (GB); Jason Roderick Hector, Redhill (GB); Nigel David Young, Redill (GB)

(73) Assignee: Koninklijke Philips Electronics N.V., Eindhoven (NL)

( * ) Notice: Subject to any disclaimer, the term of this patent is extended or adjusted under 35 U.S.C. 154(b) by 416 days.

(21) Appl. No.: 10/507,768

(22) PCT Filed: Feb. 21, 2003

(86) PCT No.: PCT/IB03/00670

§ 371 (c)(1),
(2), (4) Date: Sep. 15, 2004

(87) PCT Pub. No.: WO03/079440

PCT Pub. Date: Sep. 25, 2003

(65) Prior Publication Data

US 2005/0122288 A1    Jun. 9, 2005

(30) Foreign Application Priority Data

Mar. 20, 2002  (GB)  .................... 0206551.4
Apr. 26, 2002  (GB)  .................... 0209559.4
Jul. 11, 2002   (GB)  .................... 0216058.8

(51) Int. Cl.
    *H01J 1/62* (2006.01)

(52) U.S. Cl. ..................................... 313/500; 313/505
(58) Field of Classification Search ............. 315/169.3, 315/169.4; 313/495, 496, 497, 500, 503, 313/505, 36; 345/45–46, 50, 55, 87
See application file for complete search history.

(56) References Cited

U.S. PATENT DOCUMENTS

| | | | |
|---|---|---|---|
| 6,323,594 B1 * | 11/2001 | Janning | 313/495 |
| 6,475,845 B2 * | 11/2002 | Kimura | 438/200 |
| 6,521,913 B1 * | 2/2003 | Murade | 257/59 |
| 6,777,710 B1 * | 8/2004 | Koyama | 257/59 |
| 6,912,020 B2 * | 6/2005 | Kawata | 349/44 |
| 6,928,271 B2 * | 8/2005 | Fish et al. | 455/97 |
| 2005/0122288 A1 * | 6/2005 | Fish et al. | 345/76 |

* cited by examiner

*Primary Examiner*—Shih-Chao Chen
*Assistant Examiner*—Minh Dieu A

(57) ABSTRACT

Physical barriers (210) are present between neighbouring pixels (200) on a circuit substrate (100) of an active-matrix electroluminescent display device, particularly with LEDs (25) of organic semiconductor materials. In order to reduce parasitic capacitance in the circuit substrate, the invention forms these barriers (210) with metal or other electrically conductive material (240) that provides at least part of the signal lines (160) at a higher level than the circuit substrate (100). This conductive barrier material (240) is connected to the matrix circuitry within the substrate (100) but is insulated (40) at least at the sides adjacent to the LEDs (25). Preferably, an inter-capacitance guard line (9) is included in the circuit substrate (100) between the signal lines (160) and the circuitry in the substrate (100).

17 Claims, 6 Drawing Sheets

ACTIVE MATRIX ELECTROLUMINESCENT DISPLAY DEVICES, AND THEIR MANUFACTURE

This application is a 371 of PCT/IB03/00670 Feb. 21, 2003.

This invention relates to active-matrix electroluminescent display devices, particularly but not exclusively using light-emitting diodes of semiconducting conjugated polymer or other organic semiconductor materials. The invention also relates to methods of manufacturing such devices.

Such active-matrix electroluminescent display devices are known, comprising an array of pixels present on a circuit substrate, wherein each pixel comprises an electroluminescent element, typically of organic semiconductor material. The electroluminescent elements are connected to circuitry in the substrate, for example drive circuitry that includes supply lines and matrix addressing circuitry that includes addressing (row) and signal (column) lines. These lines are generally formed by thin-film conductor layers in the substrate. The circuit substrate also includes addressing and drive elements (typically thin-film transistors, hereafter termed "TFT"s) for each pixel.

In many such arrays, physical barriers of insulating material are present between neighbouring pixels in at least one direction of the array. Examples of such barriers are given in published United Kingdom patent application GB-A-2 347 017, published PCT patent application WO-A1-99/43031, published European patent applications EP-A-0 895 219, EP-A-1 096 568, and as EP-A-1 102 317, the whole contents of which are hereby incorporated herein as reference material.

Such barriers are sometimes termed "walls", "partitions", "banks", "ribs", "separators", or "dams", for example. As can be seen from the cited references, they may serve several functions. They may be used in manufacture to define electroluminescent (layers and/or electrode layers of the individual pixels and/or of columns of pixels. Thus, for example, the barriers prevent pixel overflow of conjugate polymer materials that may be ink-jet printed for red, green and blue pixels of a colour display or spin-coated for a monochrome display. The barriers in the manufactured device can provide a well-defined optical separation of pixels. They may also carry or comprise conductive material (such as upper electrode material of the electroluminescent element), as auxiliary wiring for reducing the resistance of (and hence the voltage drops across) the common upper electrode of the electroluminescent elements.

Very good image quality is achievable active-matrix electroluminescent displays with switched current mirror pixel circuits. Such a display device is disclosed in published U.S. patent application US-A-2001/0052606 (Philips ref: PHNL000281), the whole contents of which are hereby incorporated herein as reference material. This requires the columns of the display to be addressed with very small currents over the line time of the display. In the case of large displays the column capacitance becomes high, which means that the time constant for addressing the pixels to the correct current level becomes large. High resolutions for the display make the situation even more difficult by shortening the line time.

It is an aim of the present invention to exploit, develop, adapt and/or extend particular features of active-matrix electroluminescent display devices, so as to reduce such problems relating to the signal lines (column conductors), in a manner that is compatible with the basic device structure, its layout and its electronics. According to one aspect of the present invention, there is provided an active-matrix electroluminescent display device having the features set forth in various embodiments described herein.

In accordance with the invention, the physical barriers between pixels are formed with electrically-conductive material (typically metal), that is used to provide at least part of the signal lines (column conductors) at a higher level than the circuit substrate. Thus, the column capacitance issues are transferred from within the circuit substrate (where they are severely constrained by circuitry layout) to the much freer environment of the pixel barriers on the substrate. This transfer readily permits a reduction in column capacitance and hence in the time constant for addressing pixels to the correct current level. The conductive barrier material is connected with the matrix addressing circuitry within the circuit substrate, while also being insulated at least at the sides of the barriers adjacent to the electroluminescent elements.

Much versatility is possible in accordance with the invention. Various structural features can be adopted for the pixel barriers. Thus, the barriers may be predominantly of conductive material or insulating material and may have insulating and/or conducting coatings. Preferably an inter-capacitance guard line is included at least between the signal lines of the barriers and the circuitry of the circuit substrate. A voltage buffer may be connected between the signal line and the guard line to keep the voltage therebetween near zero.

According to another aspect of the present invention, there are also provided advantageous methods of manufacturing such an active-matrix electroluminescent display device.

Various advantageous features and feature-combinations in accordance with the present invention are set out in the appended claims. These and others are illustrated in embodiments of the invention that are now described, by way of example, with reference to the accompanying diagrammatic drawings, in which:

Figure 1:
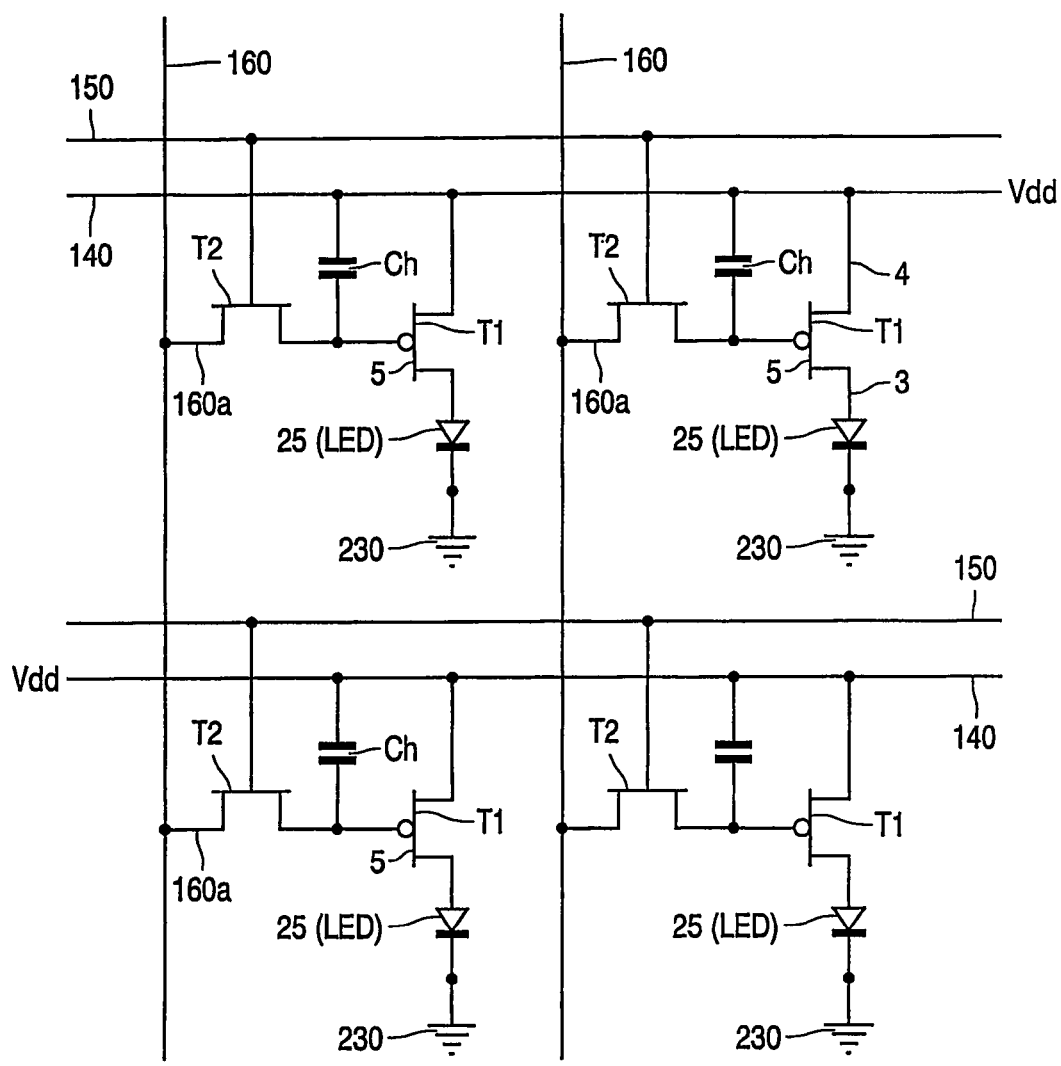
FIG. 1 is a circuit diagram for four pixel areas of an active-matrix electroluminescent display device which can be provided with conductive barrier material for its signal lines in accordance with the invention.

It should be noted that all the Figures are diagrammatic. Relative dimensions and proportions of parts of these Figures have been shown exaggerated or reduced in size, for the sake of clarity and convenience in the drawings. The same reference signs are generally used to refer to corresponding or similar features in modified and different embodiments.

EMBODIMENTS OF FIGS. 1 AND 3

Figure 3:
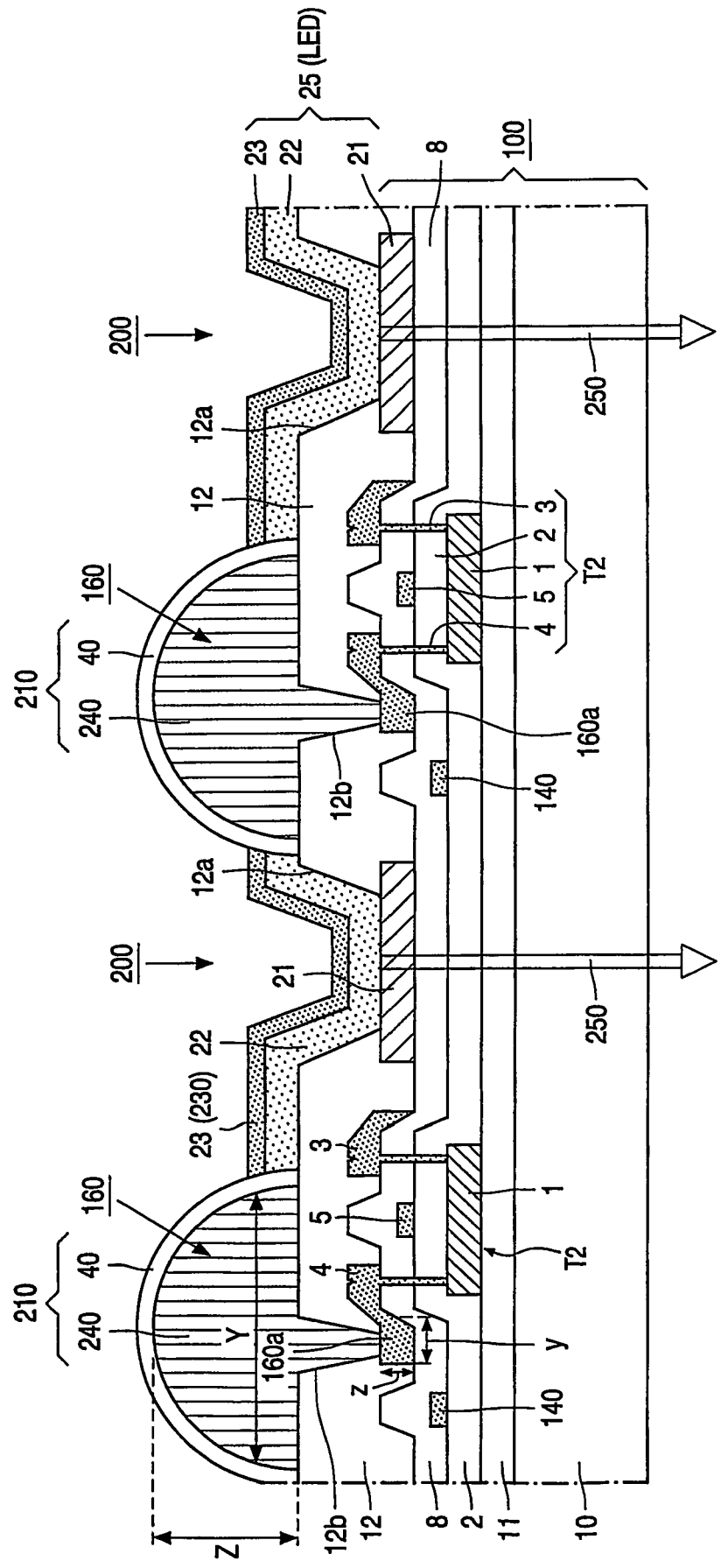
FIG. 3 is a cross-sectional view of part of the pixel array and circuit substrate of one embodiment of an active-matrix electroluminescent display device, showing one example of a conductive barrier construction for its signal lines in accordance with the invention.

The active-matrix electroluminescent display device of the FIGS. 1 and 3 embodiments comprises an array of pixels 200 on a circuit substrate 100 with matrix addressing circuitry. Physical barriers 210 are present between at least some of the neighbouring pixels in at least one direction of the array. At least some of these barriers 210 are constructed with conductive barrier material 240 that is used as at least part of the signal lines (column conductors) 160 in accordance with the present invention. Apart from this special construction and use of the barriers 210 in accordance with the present invention, the display may be constructed using known device technologies and circuit technologies, for example as in the background references cited hereinbefore.

The matrix addressing circuitry comprises transverse sets of addressing (row) and signal (column) lines 150 and 160, respectively, as illustrated in FIG. 1. An addressing element T2 (typically a thin-film transistor, hereafter termed "TFT") is incorporated at each interception of these lines 150 and 160. It should be understood that FIG. 1 depicts, by way of example, one specific pixel circuit configuration. Other pixel circuit configurations are known for active matrix electroluminescent display devices. It should readily be understood that the present invention may be applied to the pixel barriers of such a device regardless of the specific pixel circuit configuration of the device.

As illustrated in FIG. 1, each pixel 200 comprises a current-driven electroluminescent element 25 (21,22,23), typically a light-emitting diode (LED) of organic semiconductor material. The LED 25 is connected in series with a drive element T1 (typically a TFT) between two voltage supply lines 140 and 230 of the array. These two supply lines are typically a power supply line 140 (with voltage Vdd) and a ground line 230 (also termed "return line"). Light emission from the LED 25 is controlled by the current flow through the LED 25, as altered by its respective drive TFT T1.

Each row of pixels is addressed in turn in a frame period by means of a selection signal that is applied to the relevant row conductor 150 (and hence to the gate of the addressing TFTs T2 of the pixels of that row). This signal turns on the addressing TFT T2, so loading the pixels of that row with respective data signals from the column conductors 160. These data signals are applied to the gate of the individual drive TFT T1 of the respective pixel. In order to hold the resulting conductive state of the drive TFT $T_1$, this data signal is maintained on its gate 5 by a holding capacitor Ch that is coupled between this gate 5 and the drive line 140,240. Thus, the drive current through the LED 25 of each pixel 200 is controlled by the driving TFT T1 based on a drive signal applied during the preceding address period and stored as a voltage on the associated capacitor Ch. In the specific example of FIG. 1, T1 is shown as a P-channel TFT, whereas T2 is shown as an N-channel TFT.

This circuitry can be constructed with known thin-film technology. The substrate 100 may have an insulating glass base 10 on which an insulating surface-buffer layer 11, for example, of silicon dioxide is deposited. The thin-film circuitry is built up on the layer 11 in known manner FIG. 3 shows a particular example for the TFT T2 comprising: an active semiconductor layer 1 (typically of polysilicon); a gate dielectric layer 2 (typically of silicon dioxide); a gate electrode 5 (typically of polysilicon or aluminium); and metal electrodes 3 and 4 (typically of aluminium) which contact doped source and drain regions of the semiconductor layer 1 through windows (vias) in the over-lying insulating layer(s) 2 and 8.

Depending on the particular TFT (for example T1 or T2 or another TFT of the circuit substrate) and its circuit function, extensions of the electrodes 3, 4 and 5 may form, for example, interconnections between the elements T1, T2, Ch and LED 25, and/or at least part of the conductor lines 140, 150 and 160. FIG. 3 shows a small-area local extension 160a of electrode 4 of T2 as a connection for the signal line 160. A line extension of gate electrode 5 of T2 forms the addressing (row) line 150. A line extension of electrode 4 of T1 (not shown in FIG. 3) may form the power supply line 140.

The holding capacitor Ch may be formed similarly, in known manner, as a thin-film structure inside the circuit substrate 100.

The LED 25 typically comprises a light-emitting organic semiconductor material 22 between a lower electrode 21 and an upper electrode 23. In a preferred particular embodiment, semiconducting conjugated polymers may be used for the electroluminescent material 22. For a LED that emits its light 250 through the substrate 100, the lower electrode 21 may be an anode of indium tin oxide (ITO), and the upper electrode 23 may be a cathode comprising, for example, calcium and aluminium. FIG. 3 illustrates a LED construction in which the lower electrode 21 is formed as a thin film in the circuit substrate 100. The subsequently-deposited organic semiconductor material 22 contacts this thin-film electrode layer 21 at a window 12a in a planar insulating layer 12 (for example of silicon nitride) that extends over the thin-film structure of the substrate 100.

As in known devices, the device of FIGS. 1 and 3 in accordance with the present invention include physical barriers 210, between at least some of the neighbouring pixels in at least one direction of the array. These barriers 210 may also be termed "walls", "partitions", "banks", "ribs", "separators", or "dams", for example. Depending on the particular device embodiment and its manufacture, they may be used in known manner, for example:

to separate and prevent overflow of a polymer solution between the respective areas of the individual pixels 200 and/or columns of pixels 200, during the provision of semiconducting polymer layers 22;

to provide a self-patterning ability on the substrate surface in the definition of the semiconducting polymer or other electroluminescent layers 22 for the individual pixels 200 and/or for columns of pixels 200 (and possibly even a self-separation of individual electrodes for the pixels, for example an individual bottom layer of the upper electrodes 23);

to act as a spacer for a mask over the substrate surface during the deposition of at least an organic semiconductor material 22 and/or electrode material;

to form opaque barriers 210 for a well-defined optical separation of the pixels 200 in the array, when light 250 is emitted through the top (instead of, or as well as, the bottom substrate 100).

Whatever their specific use in these known ways, the physical barriers 210 that extend parallel to the array columns in embodiments of the present invention are constructed and used in a special manner. Thus, the pixel barriers 210 of FIG. 3 comprises metal 240 (or other electrically-conductive material 240) that provides at least part of the signal lines (column conductors) 160 at a higher level than the circuit substrate 100, thereby reducing the column capacitances.

This conductive barrier material 240 is insulated at its sides adjacent the LEDs 25 and is connected to the main electrode 4 of the addressing TFT at its extension 160a. As illustrated in FIG. 3, these connections of the conductive barrier material 240 to the TFTs T2 occur at individual connection windows 12b in the intermediate insulating layer 12 at each pixel along the column. Thus, this conductive barrier material 240 is able to provide the signal lines 160 over most of their length adjacent to the pixels.

Figure 2:
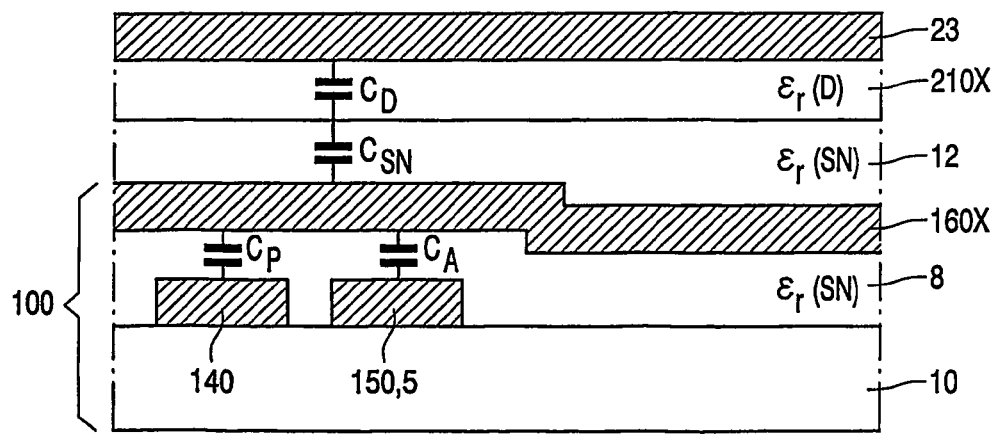
FIG. 2 is a schematic section illustrating parasitic capacitances in a pixel area of a prior art type of display device.

This special construction and use of the barriers 210 for the signal lines 160 in accordance with the invention permits the reduction of prior art column capacitances that are illustrated in FIG. 2. Thus, FIG. 2 illustrates the capacitances seen by the signal (column) line over each individual pixel in a typical prior art arrangement. In this known arrangement, the signal (column) lines 160X are formed entirely within the circuit substrate 100 as, for example, a line extension 160X of the TFT electrode 4. The barriers 210X are simply of insulating material (for example, an insulating polymer). There is a parasitic capacitance ($C_D$ & $C_{SN}$) between the thin-film column line 160X and the LED upper electrode 23 (typically the cathode in a polymer LED 25), across the dielectrics 12 and 210X. High parasitic capacitances $C_P$ and $C_A$ occur between the thin-film column line 160X and the power supply line 140 and address (row) line 150, respectively, across the dielectric 8 (typically silicon nitride). As a result of this high column capacitance the time constant for addressing the individual pixels in this device arrangement to the correct current levels becomes unacceptably large for a large display.

The present invention avoids this problem by forming and using the pixel barriers 210 with metal 240 (or other electrically-conductive material 240), in the pixel areas, as the signal lines (column conductors) 160, i.e. at a higher level than the circuit substrate 100. Thus, as can be seen from FIG. 3, the top planarising insulating layer 12 of the circuit substrate 100 is now interposed as an additional dielectric between the barrier-formed signal lines 160 and the thin-film lines 150 and 5,150 of the circuit substrate 100. Thus, the high parasitic capacitances $C_P$ and $C_A$ are reduced significantly.

FIG. 3 illustrates one particular embodiment in which the pixel barriers 210 are predominantly of electrically-conductive material 240, 240x, preferably metal for very low resistivity (for example aluminium or copper or nickel or silver). Thus, these barriers 210 of FIG. 3 comprise a bulk or core 240 of the conductive material that has an insulating coating 40 (for example of silicon dioxide or nitride) on its sides and on its top. FIG. 3 shows, by way of example, the upper electrode 23 of the pixel LED 25 adjoining this insulating coating 40. Thus, the electrodes 23 may have a stripe-geometry in their layout across the pixel array. Alternatively, if sufficient thick insulator is used for the coating 40, the pixel array may have a common electrode 23 that extends also over the pixel barriers 210.

ALTERNATIVE COLUMN-LINE BARRIER EMBODIMENTS OF FIGS. 4 AND 5

Figure 4:
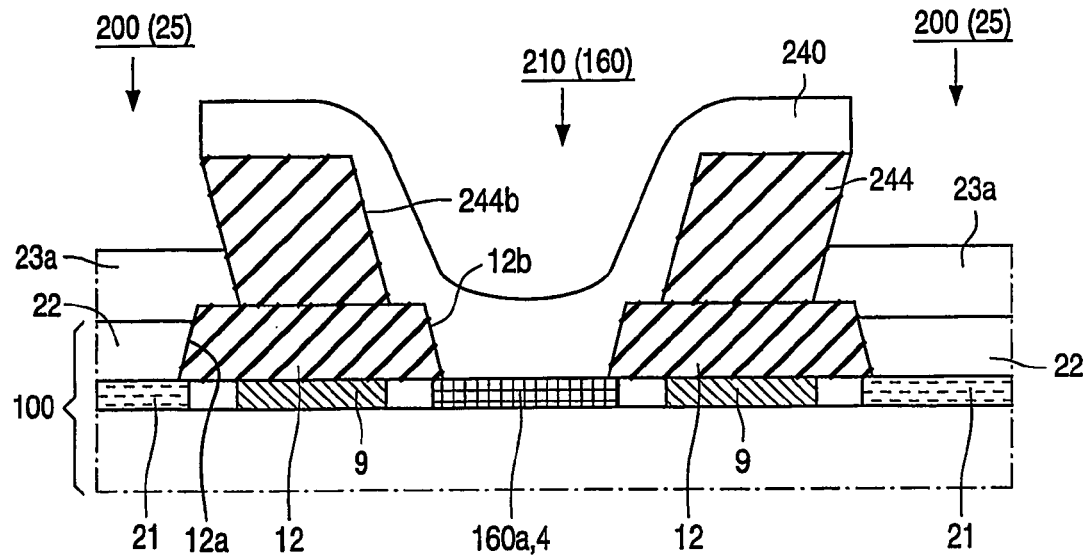
FIG. 4 is a sectional view of a device part with another example of a conductive barrier construction using a metal coating for its signal lines in accordance with the invention.

FIG. 4 shows a modified embodiment wherein the barrier 210 is predominantly of insulating material 244. In this case, vias 244b are etched or milled through the insulating material 244 to the electrode area 160a, 4, in the circuit substrate 100. A metal coating 240 provides the conductive barrier material that extends on top of the insulating barrier 210 and in the vias 244b therethrough.

Figure 11:
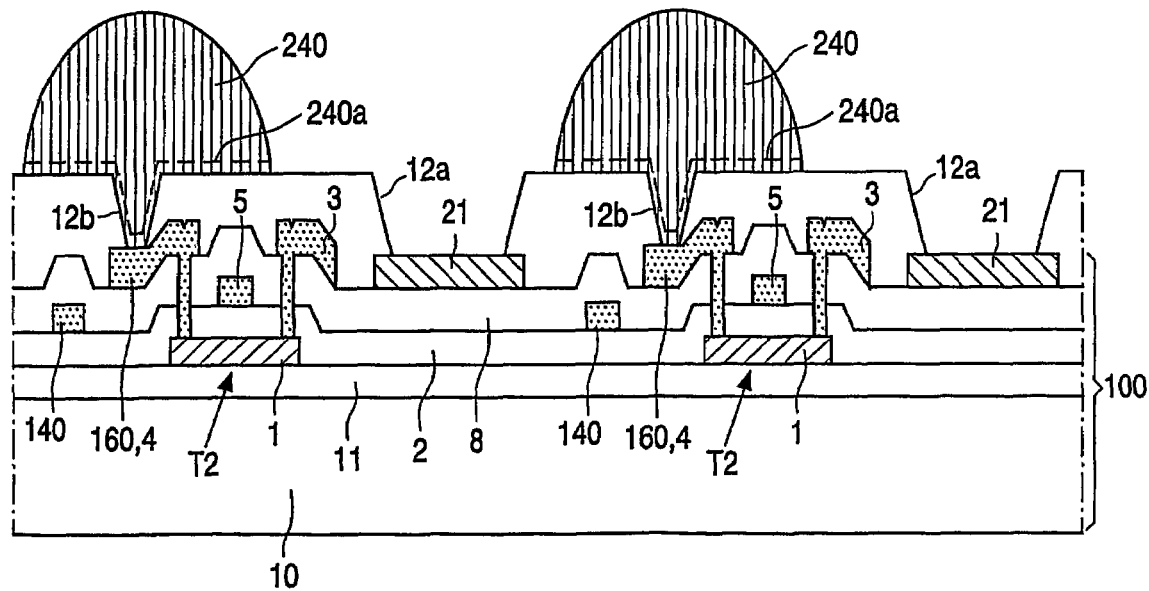
Figure 12:
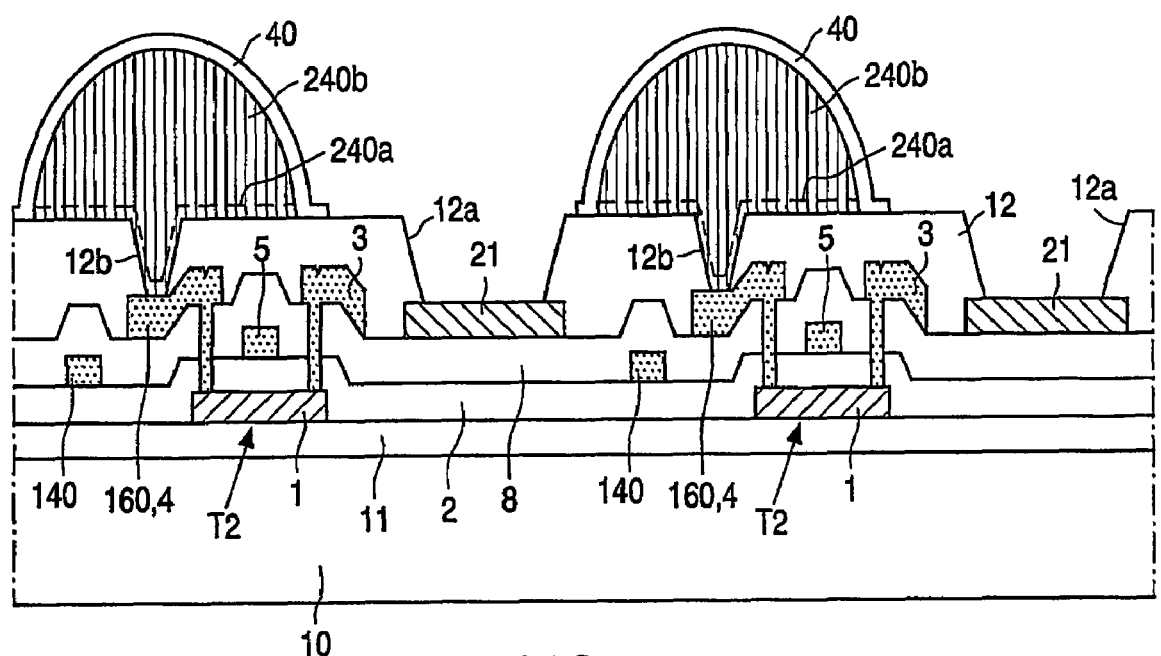
Figure 13:
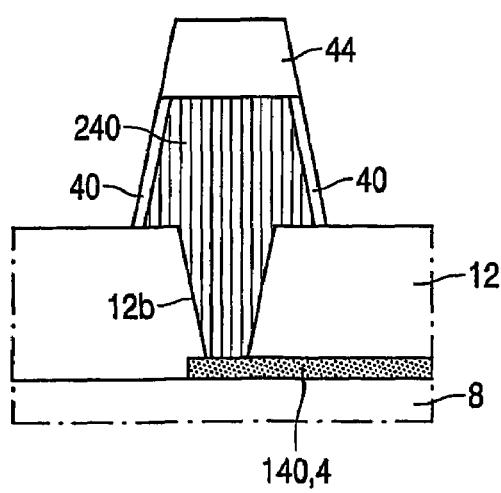
FIG. 13 is a sectional view a device part at the FIG. 12 stage, illustrating a modification in the insulation of the conductive barrier material that is also in accordance with the present invention.

The metal coating 240 of this barrier 210 may be formed simultaneously with a main part 23a of the upper electrode 23 of the LED 25, in a self-aligned manner. Thus, a layer of metal may be deposited simultaneously for the metal coating 240 and electrode 23 which are separated by a shadow-masking effect of an overhang shape in the side of the barrier 210, as illustrated in FIG. 4. This is one possible process embodiment for column-line barriers 210, 240 in accordance with the present invention. FIGS. 11 to 13 illustrate other process embodiments for column-line barriers 210, 240 that are predominantly of metal.

Figure 5:
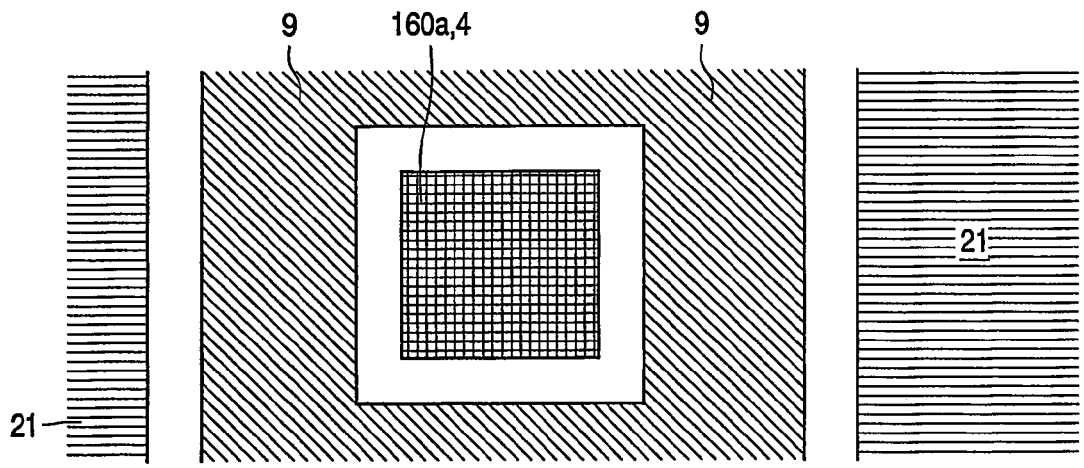
FIG. 5 is a plan view of the layout of a conductive layer pattern of the circuit substrate of the FIG. 4 device, for including a guard line in a particular embodiment of a device in accordance with the invention.
Figure 6:
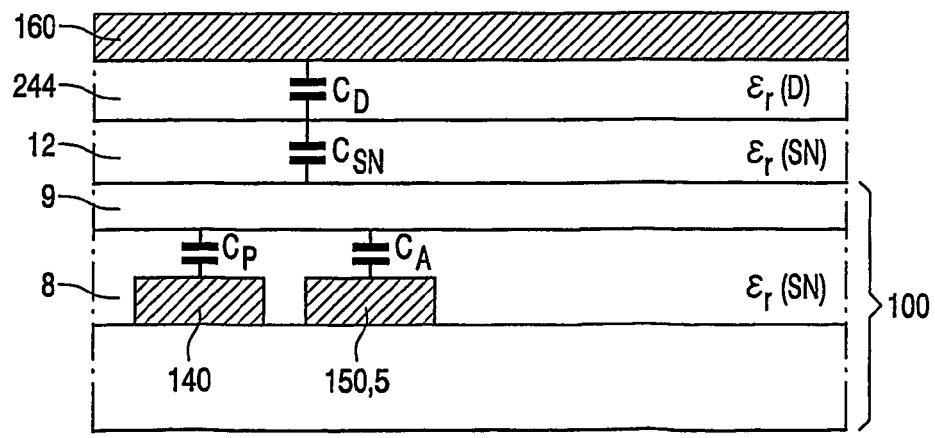
FIG. 6 is a schematic section similar to that of FIG. 2, but illustrating parasitic capacitances in a pixel area of the display device of FIGS. 4 and 5 in accordance with the invention.

FIGS. 4 and 5 together illustrate a guard-line feature that can also be advantageously included in an embodiment of the present invention. In this embodiment, a thin-film conductor layer 9 (that can be formed simultaneously with TFT electrode areas 3, 4 and 160a) extends as an inter-capacitance guard line below the conductive barrier material 240 of the signal lines 160. Thus, this guard line 9 is present as a shield between the circuitry of the substrate 100 and the column lines 160 over most of their length. FIG. 6 illustrates the capacitances now seen by the column line 160 over each individual pixel. Very low column capacitances can be achieved, particularly when the FIG. 6 arrangement is used together with an advantageous buffer circuit feature such as that shown in FIG. 7.

PARTICULAR GUARD-LINE EMBODIMENTS OF FIGS. 6 AND 7

In the FIG. 6 arrangement, the respective capacitances $C_P$ and $C_A$ Of the power line 140 and row line 150 are formed (across dielectric 8) with the guard line 9 (rather than with the column line 160 as in the prior art FIG. 2). Furthermore, the respective capacitances $C_{SN}$ and $C_D$ of dielectrics 12 and 244 are formed between the guard line 9 and the column line 160 in the FIG. 4 embodiment.

Figure 7:
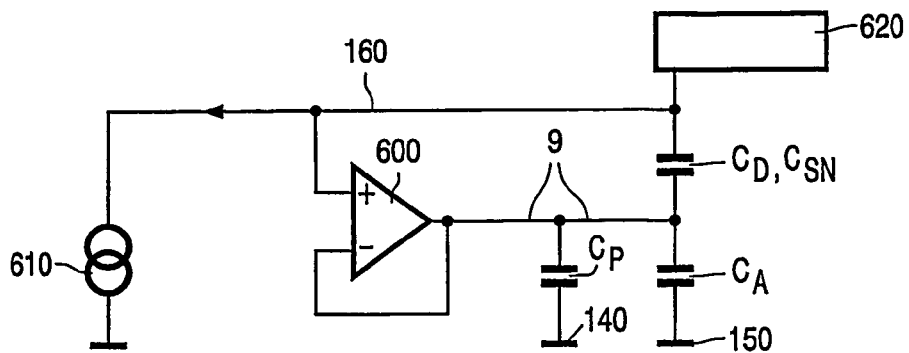
FIG. 7 is a circuit diagram of a voltage buffer arrangement for a guard line in a device embodiment such as that of FIGS. 4 to 6.

Very low column capacitance can now be achieved using the buffer circuit configuration of FIG. 7. In this case, a voltage buffer 600 is connected between the column line 160 and the guard line 9. The basic circuit of FIG. 7 can be of known type, apart from the inclusion of buffer 600 and guard line 9 and the barrier construction of the column line 160. Thus, 620 may represent a known type of current mirror pixel circuit, for example as disclosed in US-A-2001/0052606. Signals are supplied to the column line 160 by a column driver 610 of, for example, a know current sink type. The column driver 610 and the voltage buffer 600 can be implemented externally in an IC (integrated circuit) connected to the circuit substrate 100. Alternatively, they may be integrated internally on the circuit substrate 100, using polysilicon TFT technology.

The voltage buffer 600 takes as its input the signal voltage at the output of the column driver 610 and buffers it onto the guard line 9. As a result, the voltage between the column line 160 and guard line 9 is zero or nearly zero, so that no charge accumulates on this column-guard capacitance $C_D$, $C_{SN}$ and all current is drawn from the pixel circuit 620. This allows rapid operation. The voltage buffer needs to charge the capacitances $C_P$ and $C_A$ between the guard line 9 and the respective power and address lines 140 and 150, but a low output impedance of the buffer 600 allows this to be achieved rapidly.

MULTI-CONDUCTOR BARRIER EMBODIMENTS OF FIGS. 8 AND 9

Figure 8:
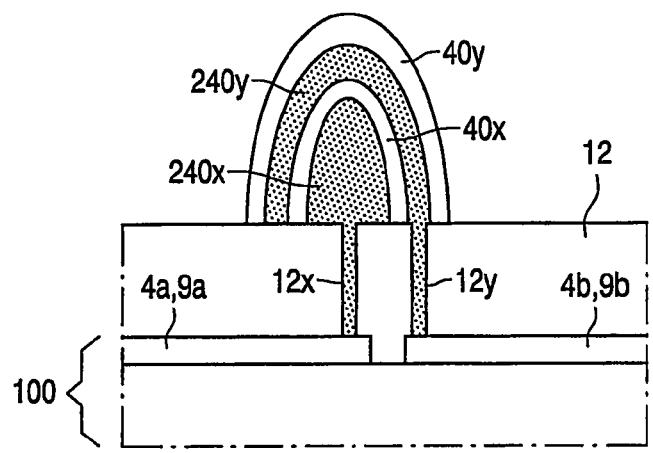
FIG. 8 is a cross-sectional view of a conductive barrier construction that is similar to that of FIG. 3, but with the additionally inclusion of a metal coating for a modified embodiment in accordance with the invention.

The embodiment of FIG. 8 is similar to that of FIG. 3, in that the barrier 210 comprises a metal core 240x with an insulating coating 40a thereon. However, the FIG. 8 embodiment additionally comprises a metal coating 240y that is present on the insulating coating 40a, over the top and sides of the core 240x.

This structure of FIG. 8 is more versatile than that of FIG. 3. It permits the metal core 240x and metal coating 240y to be used for different purposes. Thus, for example, the metal core 240x may provide the column (signal) line 160 as in FIG. 3, and so be connected with the electrode 4 of TFT T2. The metal coating 240y may serve as a co-axial shield for the signal on the core line 240x. The metal coating 240y may be connected to part of a guard line 9b in the substrate 100 and/or to another circuit element, for example, of another TFT. Alternatively, the metal coating 240y may provide the column (signal) line 160, and the metal core 240x may form part of a guard line 9a.

Instead of shielding the column (signal) line 160, this multi-conductor structure 240x, 240y for the barrier 210 might be used elsewhere in the display for a different purpose, for example to overlap two lines such as 140 and 150, or to form an additional component. The metal coating 240y may be localised to specific locations along the barrier 210 where particular connections or components are required, for example at individual pixels or sub-pixels.

Of particular importance is an embodiment in which the multi-conductor structure 240x, 240y of FIG. 8 is designed to form a capacitor with a capacitor dielectric 40a. Thus, separate and/or insulated lengths of the metal core 240x, insulating coating 40a and metal coating 240y may together form a capacitor connected between the substrate circuit elements 4, 5, etc. Such a capacitor may be, for example, the individual holding capacitor Ch for each respective pixel 200 which is connected between the supply line 140 (main electrode line 4 of TFT T1) and the gate line 5 of TFT T2 (and main electrode line 3 of TFT T1).

Figure 9:
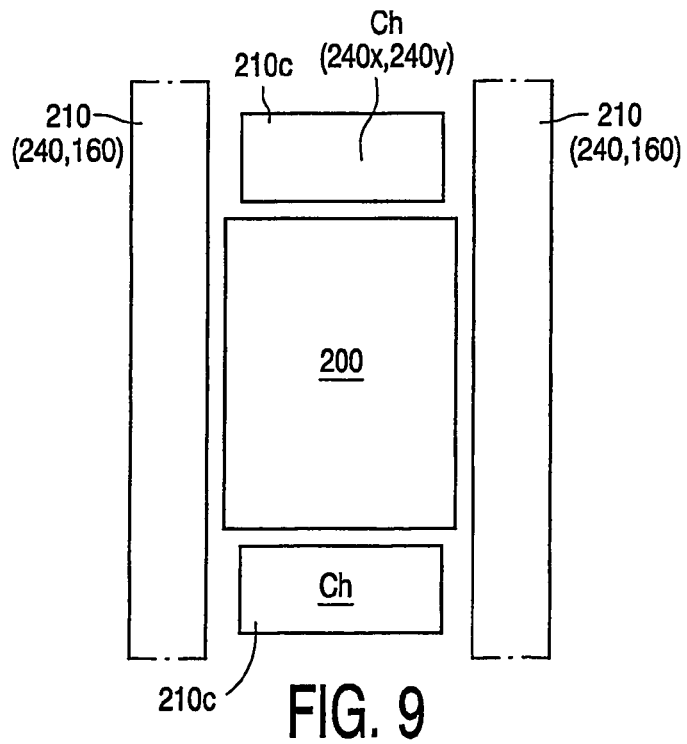
FIG. 9 is a plan view of an example of layout features for a particular embodiment of a device in accordance with the invention, with transverse conductive barriers.

FIG. 9 illustrates a suitable pixel layout for integrating such a multi-conductor barrier construction 240x, 240y as a holding capacitor Ch for each pixel area 200. In this case, the multi-conductor barrier construction 240x, 240y comprises insulated barrier lengths that extend transverse to the column-forming barriers 210 (240,160).

Alternatively, the transverse barrier layout of FIG. 9 may be adopted with barriers 210 and 210c each of which comprises a single metal conductor 240 (without the metal coating 240y) as in FIG. 3 or as in. FIG. 4. In this case, the conductive barrier material 240 of the transverse barriers 210c may be connected to the gate line 5, 150 of TFT T2 to back-up and/or replace lengths of the addressing (row) lines 150. The line resistance of the row line can be significantly reduced in this way, due to the conductive barrier material 240 having a cross-sectional area that is at least twice (possibly even an order of magnitude) larger than that of the conductor layer that typically provides a gate line 5(150) of a TFT in the circuit substrate 100. Furthermore, the gate line 5(150) is typically of doped polysilicon, whereas the conductive barrier material 240 is typically metal having a much higher conductivity.

PROCESS EMBODIMENT OF FIGS. 10 TO 12

Apart from constructing and using its barriers 210 with conductive material 240 for the signal lines 160, the active-matrix electroluminescent display of a device in accordance with the present invention may be constructed using known device technologies and circuit technologies, for example as in the cited background references.

Figure 10:
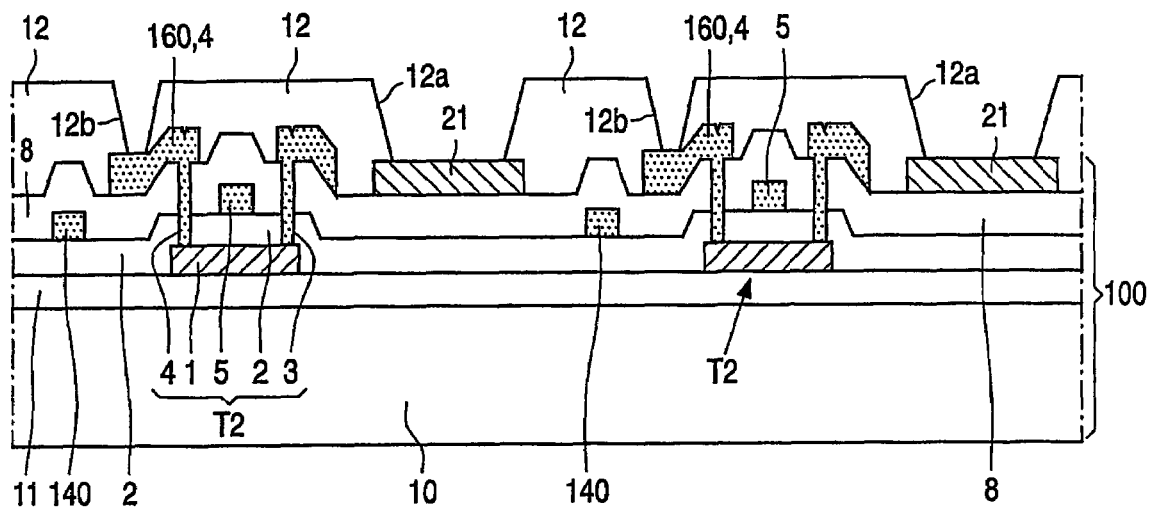
FIGS. 10 to 12 are sectional views of a device part such as that of FIG. 3 at stages in its manufacture with one particular embodiment in accordance with the invention.

FIGS. 10 to 12 illustrate novel process steps in a particular manufacturing embodiment. The thin-film circuit substrate 100 with its upper planar insulating layer 12 (for example, of silicon nitride) is manufactured in known manner. Connection windows (such as vias 12a, 12b, 12x, etc.) are opened in the layer 12 in known manner, for example by photolithographic masking and etching. However, in order to manufacture a device in accordance with the present invention, the pattern of these vias include the vias 12b, 12x, 12y that expose elements 4, 5, etc. for bottom connection with the conductive barrier material 240, 240x, 240y etc. The resulting structure is illustrated in FIG. 10. This stage is common regardless of whether the barriers 210 have a metal core as in FIGS. 3 and 8 or are predominantly of insulating material as in FIG. 4.

The formation of barriers 210 predominantly of insulating material has been described above with reference to FIG. 4. Suitable process steps for barriers 210 with a metal core will now be described with reference to FIGS. 11 and 12.

In this case, electrically-conductive material for the barriers 210 is is deposited on the insulating layer 12 at least in its vias 12a, 12b etc. The desired lengths and layout pattern for the barriers 210 is obtained using known masking techniques. FIG. 11 illustrates an embodiment in which at least the bulk 240 of the conductive barrier material (for example, copper or nickel or silver) is deposited by plating. In this case, a thin seed layer 240a of, for example, copper or nickel or silver is first deposited over the insulating layer 12 and its vias 12a, 12b, 12x etc, the barrier layout pattern is defined with a photolithographic mask, and then the bulk 240 of the conductive barrier material is plated to the desired thickness. The resulting structure is illustrated in FIG. 11.

Then, using CVD (chemical vapour deposition), insulating material (for example silicon dioxide or silicon nitride) is deposited for the insulating coating 40. The deposited material is left on the sides and top of the conductive barrier material by patterning using known photolithographic masking and etching techniques, as illustrated in FIG. 12.

Thereafter the manufacture is continued in known manner. Thus, for example, conjugate polymer materials 22 may be ink-jet printed or spin-coated for the pixels 200. The barriers 240,40 with their insulating coating 40 can be used in known manner to prevent polymer overflow from the pixel areas in between the physical barriers 240,40. The upper electrode material 23 is then deposited.

MODIFIED PROCESS EMBODIMENT OF FIG. 13

This embodiment uses an anodisation treatment (instead of deposition) to provide the insulating coating 40 at least at the sides of the barriers 210 adjacent to the pixel areas. Typically, the conductive barrier material 240 may comprise aluminium. The desired lengths and layout pattern of the deposited aluminium can be defined using known photolithographic masking and etching techniques. FIG. 13 shows the photolithically-defined etchant-mask 44 retained on the top of the aluminium barrier pattern 240.

Then, an anodic insulating coating of aluminium oxide is formed on at least the sides of the aluminium barrier material 240 using known anodisation techniques. Thus, no extra mask is needed to define the layout for this coating 40.

As illustrated in FIG. 13, the mask 44 can be retained during this anodisation, in areas where it is desired to protect and form an un-insulated top connection area 240t. In these areas, the anodic coating is formed at only the sides of the aluminium barrier pattern 240. The mask 44 may be removed before this anodisation, from areas where the anodic coating is required at both the sides and top of the aluminium barrier pattern 240. Alternatively, the mask 44 of an insulating polymer or, for example, silicon dioxide or nitride may be retained in these areas where insulation is desired over the top of the barrier 210(240,40) in the manufactured device.

In the embodiments described so far, the conductive barrier material 240 is a thick opaque metal, for example, aluminium, copper, nickel or silver. However, other conductive materials 240 may be used, for example a metal silicide or (less advantageously) a degenerately-doped polysilicon both of which may be surface-oxidised to form the insulating coating 40. If transparent barriers 210 are required, then ITO may be used for the conductive barrier material 240.

From reading the present disclosure, other variations and modifications will be apparent to persons skilled in the art. Such variations and modifications may involve equivalent and other features which are already known in the art (for example in the cited background references) and which may be used instead of or in addition to features already described herein.

Although claims have been formulated in this Application to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

The Applicants hereby give notice that new claims may be formulated to any such features and/or combinations of such features during the prosecution of the present Application or of any further Application derived therefrom.

The invention claimed is:

1. An active-matrix electroluminescent display device comprising:
   a circuit substrate on which an array of pixels is present with physical barriers between at least some of the neighbouring pixels in at least one direction of the array; each pixel comprising an electroluminescent element; the circuit substrate comprising matrix addressing circuitry that provides pixel addressing via transverse addressing and signal lines, the physical barriers comprising conductive material that provides at least part of the signal lines at a higher level than the circuit substrate and that is connected with the matrix addressing circuitry of the circuit substrate via contact windows in an intermediate insulating layer on the circuit substrate, wherein the conductive material is insulated at least at the sides of the barriers adjacent to the electroluminescent elements.

2. A device according to claim 1, wherein the conductive barrier material provides the signal lines over most of their length adjacent to the pixels to reduce parasitic capacitance in the circuit substrate, and the conductive barrier material is connected to the matrix addressing circuitry of the circuit substrate via individual contact windows for each pixel of the line.

3. A device according to claim 1, wherein a conductor layer in the circuit substrate extends below the conductive barrier material of the signal lines as an inter-capacitance guard line between the signal lines and the circuitry of the circuit substrate.

4. A device according to claim 3, wherein a voltage buffer is connected between the signal line and the guard line.

5. A device according to claim 1, wherein the barrier comprises a metal coating that provides the conductive barrier material of the signal lines and that is connected to the pixels via respective circuit elements in the substrate.

6. A device according to claim 5, wherein the physical barrier is predominantly of insulating material through which vias extend for connection with the electrode connections for the matrix addressing circuitry at the contact windows of the intermediate insulating layer, and wherein the metal coating extends on top of the physical barrier and in the vias through the physical barrier.

7. A device according to claim 5, wherein there is an insulating coating on at least the sides of the metal coating as insulation adjacent to the electroluminescent elements.

8. A device according to any one of claims 1, wherein the barrier comprises a metal core that provides the conductive barrier material of the signal lines, which metal core is connected to the pixels via respective circuit elements in the substrate and has an insulating coating on at least its sides.

9. A device according to claim 8, wherein a metal coating is present over the insulating coating over the top and sides of the metal core.

10. A device according to claim 1, wherein additional barriers extend parallel to the addressing lines and comprise additional conductive barrier material that is insulated from the conductive barrier material of the signal lines, and the additional conductive baffler material is connected via contact windows to parts of the addressing lines in the substrate to reduce voltage drops along the addressing lines.

11. A device according to claim 1, wherein the electroluminescent element is a light-emitting diode of organic semiconductor material.

12. A method of manufacturing an active-matrix electroluminescent display device according to any one of the preceding claims, the method comprising:
   (a) opening contact windows in the intermediate insulating layer on the circuit substrate to expose electrode connections for the matrix addressing circuitry in the circuit substrate;
   (b) forming the physical barriers on the circuit substrate with insulation at least at the sides of the physical barriers adjacent to the pixel areas; and
   (c) providing the electroluminescent elements in the pixel areas in between the physical bafflers,
   (d) depositing electrically-conductive material as a part of the physical barriers to provide at least part of the signal lines at a higher level than the circuit substrate, wherein the electrically-conductive material connects with the electrode connections for the matrix addressing circuitry via the contact windows of the intermediate insulating layer.

13. A method according to claim 12, wherein the step (b) involves forming the physical barrier predominantly of the electrically-conductive material, and an insulating coating is deposited on at least the sides this conductive barrier material.

14. A method according to claim 13, wherein at least the bulk of the conductive barrier material is deposited by plating.

15. A method according to claim 13, wherein the conductive barrier material comprises aluminium, and the insulating coating is formed on at least the sides of the aluminium barrier material by anodisation.

16. A method according to claim 12, wherein the step (b) involves forming the physical barrier predominantly of insulating material through which vias extend for connection with the electrode connections for the matrix addressing circuitry at the contact windows of the intermediate insulating layer, and wherein the electrically-conductive material of the signal lines is deposited as a conductive coating on top of the physical barrier and in the vias through the physical barrier.

17. A method according to claim 16, wherein the conductive coating for the signal lines and an upper electrode of the electroluminescent element are deposited simultaneously and are separated by a shadow-masking effect of an overhang shape in the side of the physical barrier.

* * * * *